United States Patent

McGeough et al.

[15] 3,651,434

[45] Mar. 21, 1972

[54] MICROWAVE PACKAGE FOR HOLDING A MICROWAVE DEVICE, PARTICULARLY FOR STRIP TRANSMISSION LINE USE, WITH REDUCED INPUT-OUTPUT COUPLING

[72] Inventors: Patrick L. McGeough, Somerville; George J. Gilbert, Whitehouse Station; Donald F. Henrikson, Somerset, all of N.J.

[73] Assignee: Microwave Semiconductor Corp., Somerset, N.J.

[22] Filed: Apr. 30, 1969

[21] Appl. No.: 820,392

[52] U.S. Cl. ..........................333/84 M, 333/97 R, 174/52 S, 174/DIG. 3, 317/101 CP, 317/234 N

[51] Int. Cl. ......................H01p 3/08, H05k 9/00, H05k 1/18

[58] Field of Search .........317/101 CP, 234 G, 234 N, 234 H; 333/84 M; 174/52 S, DIG. 3, 52 PE; 29/627, 626

[56] References Cited

UNITED STATES PATENTS

| | | | |
|---|---|---|---|
| 2,999,964 | 9/1961 | Glickman | 317/235 |
| 3,303,439 | 2/1967 | Fulp | 333/84 M |
| 3,308,352 | 3/1967 | Hutchins et al. | 317/234 |
| 3,471,753 | 10/1969 | Burks et al. | 317/101 CP |
| 3,478,161 | 11/1969 | Carley | 317/234 |
| 3,404,214 | 10/1968 | Elliott | 29/626 X |
| 3,520,054 | 7/1970 | Pensack et al. | 317/234 |

*Primary Examiner*—Herman Karl Saalbach
*Assistant Examiner*—Wm. H. Punter
*Attorney*—Pennie, Edmonds, Morton, Taylor and Adams

[57] ABSTRACT

An hermetically sealed microwave package for holding a transistor or other microwave device has a multiplane terminal arrangement which facilitates use with strip transmission line. Input and output circuits are shielded to reduce mutual coupling, and degenerative coupling in the common or ground plane connection is largely avoided. The input and output circuits have a strip transmission line configuration and may be designed for impedance matching purposes. A thermally conductive path is provided from the mounting surface to the exterior, and a heat sink may readily be attached.

25 Claims, 13 Drawing Figures

INVENTORS
PATRICK L. McGEOUGH
GEORGE J. GILBERT
DONALD F. HENRIKSON

BY
Pennie Edmonds Morton Taylor & Adams
ATTORNEYS

INVENTORS
PATRICK L. McGEOUGH
GEORGE J. GILBERT
DONALD F. HENRIKSON

BY

ATTORNEYS

INVENTORS
PATRICK L. McGEOUGH
GEORGE J. GILBERT
DONALD F. HENRIKSON

BY
Pennie Edmonds Morton Taylor & Adams
ATTORNEYS

INVENTORS
PATRICK L. McGEOUGH
GEORGE J. GILBERT
DONALD F. HENRIKSON
BY Connie Edmonds, Morton, Taylor & Adams
ATTORNEYS

MICROWAVE PACKAGE FOR HOLDING A MICROWAVE DEVICE, PARTICULARLY FOR STRIP TRANSMISSION LINE USE, WITH REDUCED INPUT-OUTPUT COUPLING

BACKGROUND OF THE INVENTION

Microwave packages are used for holding microwave components, particularly transistors and the like, and for providing readily available terminals for connection to other components.

Frequently it is necessary to protect components from various ambient conditions which could result in a departure from initial characteristics and performance, or cause damage to the components. Also, in the case of power components, adequate thermal conductivity is needed to insure normal operation at rated output levels without excessive temperature rise.

For many applications it is important to reduce parasitic couplings between input and output circuits insofar as possible, so as to avoid losses and reduce unwanted feedback effects which could degrade performance. This is particularly important with three-terminal devices having input and output terminals, and a terminal which is common to both the input and the output circuits.

At microwave frequencies it is customary to use transmission lines for input and output connections and frequently to interconnect components and form the components themselves. The use of transmission line circuits, rather than lumped constant circuits, greatly facilitates design and predictability of performance, especially at the higher frequencies. One type of transmission line is the so-called strip transmission line in which a conductor is supported over an extended conductive surface forming a ground plane, or is supported midway between two extended ground planes. The insulation between the conductor and ground plane or planes may be air or solid dielectric.

The present invention provides a microwave package which may be hermetically sealed after the component is in place, provides good thermal conductivity to the exterior so that heat sinks may readily be attached, eliminates parasitic couplings between input and output circuits to a large extent, and provides a multiple-plane terminal arrangement which facilitates use with strip transmission line and can be designed for impedance matching between the microwave device and external circuits.

BRIEF DESCRIPTION OF THE INVENTION

The microwave package of the invention comprises a support member or base substrate on which a spacer member is mounted, the spacer member having an aperture therein for receiving a microwave device. Spaced insulated conductive areas on the upper surface of the spacer member form input and output terminal areas. A conductive area is formed between the base substrate and spacer members and extends under the input and output terminal areas. A shielding conductive area is provided on the wall of the aperture in the spacer member adjacent but insulated from one of the terminal areas, and extends around the wall laterally of the terminal area. This shielding area is connected with the conductive area between the spacer and base substrate members, and the latter is extended down the outer edge of the base substrate and over the bottom thereof to form part of the common terminal. In this manner the input and output terminal area are shielded from each other by the common terminal area, which is usually a ground plane.

Advantageously, an inner conductive area is formed on the base substrate at the bottom of the aperture and is connected to one of the input and output terminal areas by a conductive area on the wall of the aperture which is insulated from the shielding area on the wall. The conductive area between the spacer member and base substrate then encircles the inner conductive area. In this manner parasitic paths from the terminal connected to the inner conductive area are largely confined to the adjacent common conductive area and are isolated from the other terminal area.

Preferably the base substrate is made of highly thermally conductive but electrically insulating material, and a header of thermally and electrically conductive material is attached to the bottom of the base substrate to enable ready attachment to the ground plane of a strip transmission line. Where required, a heat sink may be attached to the header.

After insertion of a microwave device into the chamber formed by the aperture in the spacer member and the top of the base substrate, and appropriate connections made, a cap is sealed over the aperture to hermetically seal the device. The cap may be of insulating material and suffices for many applications. However, to provide further isolation of input and output connections the cap is advantageously conductive and connected to the common terminal, but insulated from input and output terminal areas.

Although the package of the invention is particularly designed and adapted for mounting a transistor pellet, it can also be used to house other active or passive components as required. Such a transistor pellet, active or passive component or assembly of active or passive components to be inserted in the package will be termed a microwave device.

With a transistor in which the bottom forms the collector terminal, as is frequently the case, the collector terminal may be thermally, ultrasonically, or otherwise connected to the inner conductive area on the base substrate, thereby promoting the dissipation of heat through the base substrate to the header, and to an attached heat sink if used.

The package of the invention is particularly useful at frequencies above about one gigaHertz where transmission lines are widely used. However, it can also be used at frequencies such as a few hundred megahertz or below, where the advantages justify the cost. It will be understood that these frequencies are included in the term "microwave" as used herein. Although particularly designed for use with strip transmission line, the package can also be used, if desired, with other types of transmission lines and in lumped constant circuits.

DESCRIPTION OF THE SPECIFIC EMBODIMENTS

Figures 1, 2:
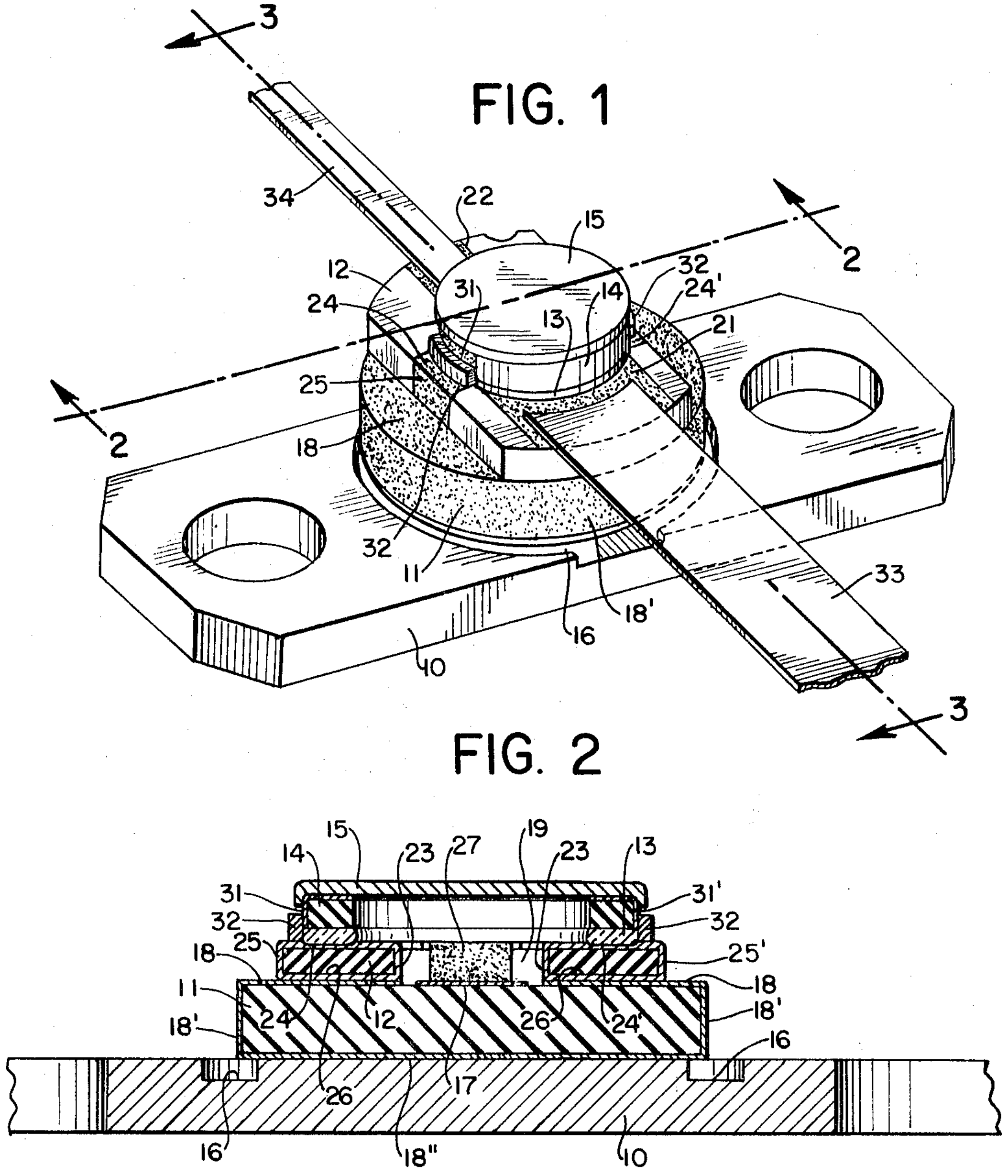
FIG. 1 is a perspective view of a microwave package in accordance with the invention.
FIGS. 2 and 3 are cross sections along the lines 2—2 and 3—3 of FIG. 1, respectively.

In the drawings, the microwave package is shown on a large scale for convenient illustration. It will be understood that for many uses it will be quite small, with package dimensions of a few tenths of an inch or so. Conductive coatings are shown in double lines, but it will be understood they may be quite thin and formed by printed circuit processes. The terms "upper," "lower," "top," "bottom," etc. will be used for convenience in the description and in the claims, and refer to the orientation as shown in the drawings. It will be understood that in use the package may have any desired orientation.

Referring to FIGS. 1–6, the microwave package is built of a number of individual parts which are separately formed and metallized in such a manner as to permit satisfactory assembly despite the small size of the package. As specifically illustrated, the package comprises a header 10, support member or base substrate 11, spacer member 12, sealing ring 13, sealing washer 14 and cap 15. A microwave device will be mounted in the package before attaching the cap, but is here omitted to avoid obscuring the package structure.

Header 10 is shown as a plate having holes therein for convenient attachment to the ground plane of a strip transmission line. A relief groove 16 is provided to avoid possible damage to the adjacent edge of the support member 11 during assembly. Advantageously, header 10 is highly thermally conductive and highly electrically conductive at microwave frequencies. For most purposes it should also be nonmagnetic, and copper may be used. Instead of being in plate form, the header could be fabricated as a stud, washer or other configuration suitable for the intended application. The header serves as a convenient external, common terminal for the package. Where a header is unnecessary for mounting purposes, it may be eliminated and the conductive coating 18 inches of support member 11 used as the common external terminal.

Figure 4:
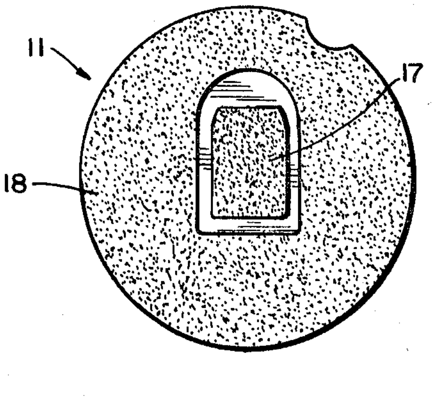
FIG. 4 is a top view of the support member as initially made.
Figure 3:
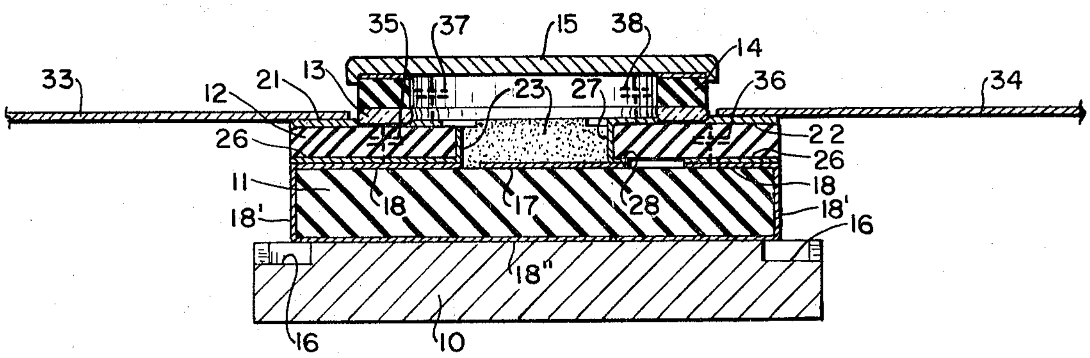

The support member or base substrate 11 is advantageously formed of thermally conductive but electrically insulating material, for example beryllia (Be0). On the upper surface, as shown in FIG. 4, the base substrate is provided with an inner conductive area 17 encircled by an outer conductive area 18. As seen in FIGS. 2 and 3, conductive area 18 is between the support member 11 and the spacer member 12 and may be termed an intermediate conductive area. As seen in FIGS. 1, 2 and 3, conductive area 18 is extended down the edge of member 11 and over the bottom thereof, as indicated at 18′ and 18″. Preferably the area 18′ extends around the entire periphery of the base substrate and area 18″ extends over the entire bottom thereof. During assembly, the bottom area 18″ is brazed to the header 10. Consequently the common terminal, usually a ground plane, is extended up to the conductive area 18 on the upper surface of the base substrate. Inner conductive area 17 is connected to one of the input and output terminals, as will be described. In the case of a transistor or the like, the collector terminal of the pellet may be connected to inner area 17. Due to the high heat conductivity of the base substrate and header, heat is effectively removed from the transistor during operation and a heat sink may be attached to the header if necessary.

Figure 5:
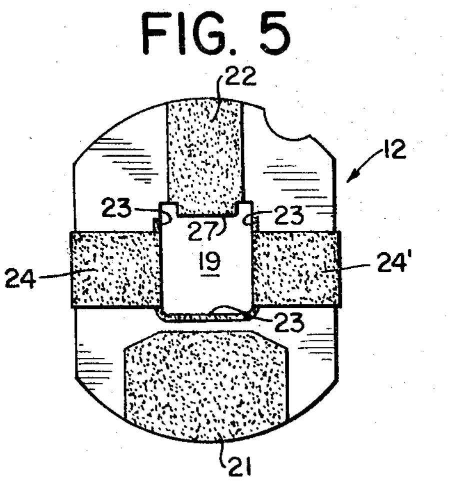
FIGS. 5 and 6 are top and bottom views of the spacer member as initially made.

The spacer member 12 is advantageously made of a suitable dielectric such as beryllia or alumina ($Al_2O_3$) and has an aperture 19 over the inner conductive area 17, thereby providing a chamber for receiving a microwave device. The spacer member is provided with predetermined metallized patterns on its surfaces. As shown in FIG. 5, the upper surface of the spacer member is provided with input and output conductive terminal areas 21 and 22. The wall of the aperture is metallized adjacent terminal area 21 and extends laterally around a major portion of the wall, as indicated at 23. The wall metallization 23 is insulated from terminal area 21 and also from terminal area 22, and continues to the conductive coating 26 (FIG. 6) on the bottom of the spacer.

Figure 6:
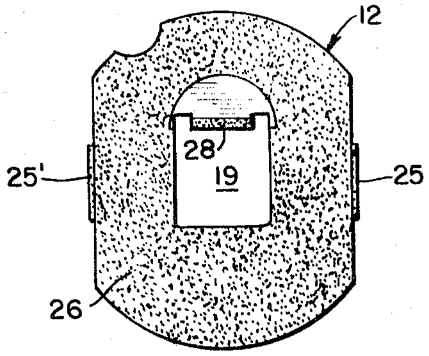

Conductive areas 24, 24′ are connected to the wall conductive area 23 and extend down the sides of the spacer member as indicated at 25 and 25′ in FIGS. 1, 2 and 6. Areas 25, 25′ are connected to the conductive coating 26 on the bottom of the spacer member. The latter is brazed or otherwise secured with the outer conductive area 18 of the base substrate 11, thereby extending the common terminal or ground plane to the wall metallization 23 of the aperture which serves to shield the input and output terminal areas from each other. Areas 24, 24′ provide points of attachment for the common connection of the microwave device when inserted in the package.

Terminal area 22 extends down a portion of the wall of the aperture as indicated at 27 and slightly over the bottom as indicated at 28. Area 28 is brazed or otherwise connected to the inner conductive area 17.

Sealing ring 13, for example of a suitable high temperature glass, is fused to the upper surface of spacer member 12. If desired, terminal areas 21 and 22 may be provided with a silver coating after fusing ring 13 in place, to improve the electrical conductivity and to allow convenient attachment of leads thereto. Sealing washer 14 may then be positioned over ring 13 and sealed in place. If desired, other conductive areas may be plated after initial metallization.

Before mounting the cap in place, the microwave device is inserted in chamber 19 and leads attached at suitable points. This will be described later. After mounting the microwave device, cap 15 is positioned over sealing washer 14 and sealed in place. When this is done, the microwave device is hermetically sealed within the package. Cap 15 may be of insulating material such as a ceramic or may be of conductive material, depending on the application. As specifically shown, cap 15 is of conductive material and sealing washer 14 is a ceramic disc having a metallized conductive coating over the entire top thereof, and extending down the wall at spaced regions 31,31′ in alignment with conductive areas 24,24′ on the upper surface of the spacer member 12. After the cap 15 has been secured in place, short blocks 32 are mounted in place to electrically connect areas 31, 31′ with areas 24, 24′, hence connecting cap 15 with the common terminal areas which extend down to the bottom of the base substrate at 18″. Consequently, the chamber containing the microwave device is almost completely surrounded by the common terminal or ground plane.

Input and output leads 33 and 34 may be attached to terminal areas 21 and 22, respectively, for convenient attachment to external circuits. The width of the terminal strips and conductive areas may be selected to provide the proper impedances for the microwave device with which the package is to be used.

The assembly of the microwave package may follow practices known in the art. One procedure is to first assemble the pre-plated header 10, base substrate 11, spacer member 12 with sealing ring 13 fused thereto (the conductive areas of 12 having been plated after fusing ring 13 in place), sealing washer 14 and leads 33, 34 using a high temperature brazing or firing operation. The microwave device may then be inserted and connections made within the sealing washer as required. Specific examples will be described hereinafter. Cap 15 may then be placed in position and sealed in place in an inert atmosphere. Alternatively, a low temperature glass frit may be used to seal the washer 14 to ring 13. The cap 15 may be brazed to the metallized upper surface of the washer. The shorting bars 32 may also be brazed in place.

If a ceramic cap is used, it may be sealed to washer 14 with a low temperature glass frit, or the washer may be made integral with the cap. Since with a ceramic cap it is unnecessary to provide a connection to the ground plane, the conductive coatings 31, 31′ on the washer and the bars 32 may be omitted. Also, the grounding areas 24, 24′ may extend only sufficiently beyond the aperture wall to provide for convenient connection of leads thereto, the remainder of the areas and also areas 25, 25′ being omitted.

The materials suggested for the various components may be changed to suit the requirements of a particular application, and the sealing procedure modified as required.

Referring now to FIGS. 7–10, the microwave package is shown inserted in a strip transmission line circuit. The strip transmission line is of the type having a layer of solid dielectric 41 provided on the bottom with a conductive coating 42 forming a ground plane. On the top, conductive areas 43 and 44 are shown having a configuration selected as desired to form a microwave circuit. A hole 45 accommodates the portion of the package above header 10. Input and output leads 33, 34 are soldered or otherwise connected to the transmission line sections. The header 10 may be bolted to the bottom of the transmission line in contact with the ground plane 42 or, as here illustrated, a heat sink 46 may be placed over header 10 and bolted in place.

Figures 8, 9, 10:
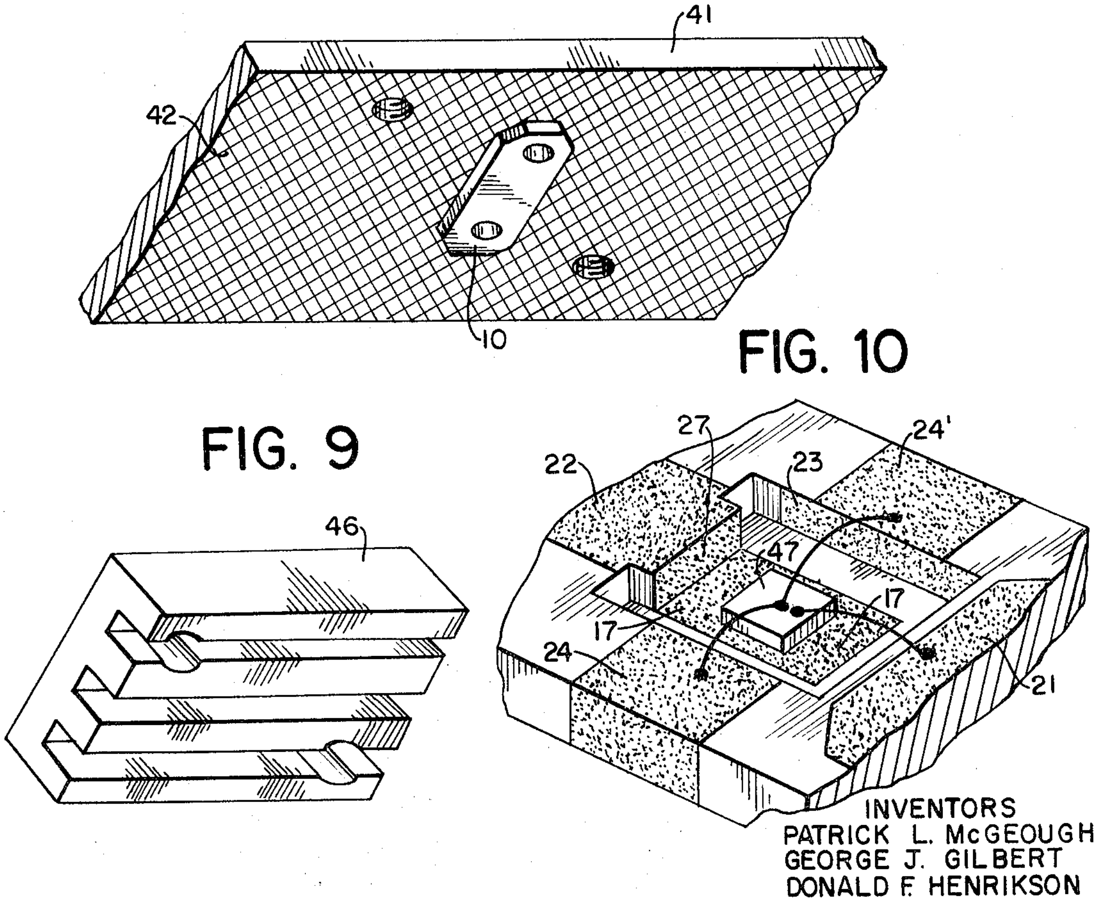
FIG. 9 shows a heat sink for the package.
FIG. 10 is a perspective view showing the mounting of a transistor pellet in the chamber of the microwave package.

FIG. 10 shows internal connections from the transistor pellet 47. It is assumed that the lower surface of the pellet is the collector and it is bonded directly to conductive area 17 and hence connected to output terminal area 22. For a common emitter connection, the emitter of the transistor is connected to grounding areas 24,24' and the base terminal is connected to the input terminal area 21. As explained above, the cap will then be hermetically sealed in place. It will be noted that by bringing the mounting surface 17 and adjacent ground plane 18 above the mounting plane of the header (FIGS. 2, 3), and providing grounding areas 24,24' immediately adjacent the chamber, the leads from the transistor pellet may be kept very short so as to minimize lead inductance and capacitance effects.

Considering the electrical aspects of the package, it will be observed from FIG. 3 that input and output terminal areas 21,22 have a strip transmission line configuration with respect to the ground plane extended up to the plane of conductive area 18. The input and output characteristic impedances are determined by the spacing of the terminal areas from surface 18, the widths of the terminal areas, the dielectric employed, etc., and may be selected to provide a proper impedance match between the input and output circuits of the microwave device inserted in the package and the external circuit connections. Different widths of leads 33 and 34 and associated terminal areas 21 and 22 are shown in FIG. 1 and FIG. 5 to illustrate different input and output impedances. Since the microwave device is closely adjacent, the impedance match may be accomplished close to the device.

In microwave devices it is usually important to reduce the mutual coupling between input and output circuits as far as possible. Coupling through parasitic capacitances are largely avoided in the present package. In FIG. 3 the dotted capacitances 35 and 36 represent the distributed capacitances between the input and output terminal areas 21, 22 and the adjacent ground plane 18. As will be observed, these are part of strip transmission line sections and can be treated accordingly. Ground plane 18 encircles conductive area 17 (FIG. 4), so that when a terminal of the microwave device is connected to 17 the close proximity of 18 reduces parasitic interelectrode effects in this region. In particular, the portion of ground plane 18 extending beneath terminal area 21 to the edge of aperture 19, and peripherally around the aperture for a distance greater than the width of area 21, largely eliminates capacitive coupling through the dielectric of spacer member 12 and support member 11 between the conductive areas 21 and 17 and, together with the portion of ground plane 18 beneath terminal area 22, between the conductive areas 21 and 22. The shielding effect of the conductive area 23 on the wall of the aperture largely eliminates direct capacitive coupling between input and output lines across the aperture 19. Dotted capacitances 37 and 38 between the terminal areas and the cap 15 are essentially to ground, and hence input-output coupling through the cap is avoided.

It is also desirable to avoid any coupling between input and output circuits through the common connection whose inductance, though small, may become appreciable at microwave frequencies. Current flowing into the package at any point will taken the shortest possible path to complete the circuit, since this will be the path of least impedance. Assuming a transistor connection as in FIG. 10, wherein the emitter is common to both input and output circuits, from FIG. 3 it will be appreciated that the major portions of the input and output paths between the emitter and the ground plane are quite separate. Thus the input circuit portion of the emitter current (base current) will flow largely in the left-hand portion of the conductive area 18 and down the adjacent side 18' of the support member to the header 10, whereas the output circuit portion of the emitter current (collector current) will flow largely in the corresponding right-hand portions, since these yield the shortest paths to respective input and output circuits. In the wall area 23, which carries emitter current to the grounded area 18, there will also be a tendency for the input circuit portion of the emitter current to flow in the portion toward the input terminal area 21, and the output circuit portion of the emitter current to flow in the portion toward the output terminal area 22. This, together with the short path down the wall, keeps the coupling very small. Accordingly the paths are largely separate up to the bond wires of the transistor, and these wires can be kept short.

Figure 11:
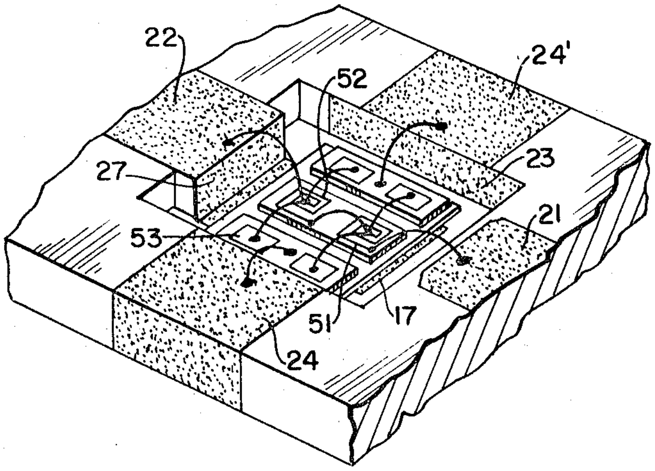
FIG. 11 is a perspective view showing the mounting of printed circuit components within the package.
Figure 12:
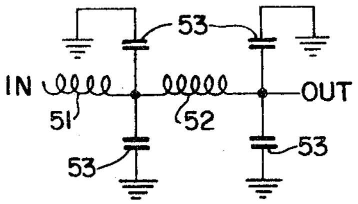
FIG. 12 is a schematic of the circuit of FIG. 11.

FIG. 11 illustrates a passive printed circuit microwave device inserted in the package. It is fabricated on an insulated substrate and has the electrical schematic shown in FIG. 12. A printed circuit inductance 51 has one terminal connected to the input terminal area 21 and the other terminal connected to a second inductance 52 whose output lead is connected to terminal area 22. Capacitors 53 have their upper plates connected to the inductances and their lower plates connected to the grounding areas 24, 24'. Enclosure in the package insures a minimum departure from the design values due to parasitic reactances, and the hermetic sealing provides protection from ambient conditions. Inasmuch as no power dissipation is required, a heat sink is unnecessary.

In this instance the inner conductive area 17 (FIGS. 3 and 4) is not used as a connection. It can be omitted if desired. However, it can also remain in place, but insulated from the lower surfaces of capacitors 53, and still assist in isolating input and output circuits. If omitted, the ground plane 18 (FIG. 4) could be extended over the entire surface of the base substrate 11.

Figure 7:
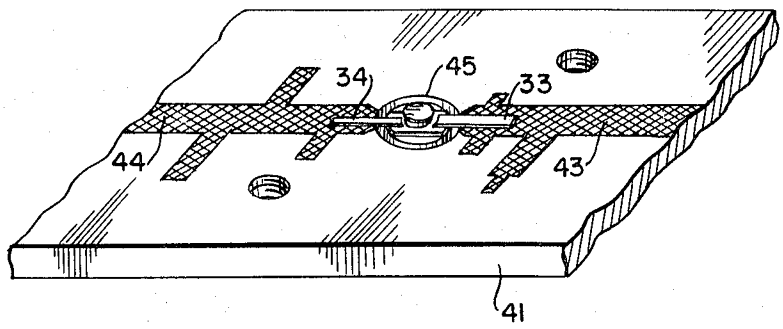
FIGS. 7 and 8 are upper and lower perspective views of a strip transmission line in which the microwave package of FIG. 1 is inserted.

With strip transmission line having two ground planes with the conductor supported therebetween, the mounting arrangement of FIGS. 7–9 may still be employed. The additional ground plane above the conductive areas 43, 44 will ordinarily be connected to the lower ground plane 42 or so energized that both ground planes are at the same potential. If desired, the ground planes could be connected together by bolts extending through the holes in header 10 or heat sink 46. Also, a conductive plug in the upper ground plane could be used to bring the upper ground plane down toward the microwave package to match the spacing between the ground plane 18 (FIG. 2) and the lower ground plane.

For some applications it may not be desired to use the header 10 as the common connection to the ground plane of a strip transmission line or to other components, or it may be desired to electrically insulate a heat sink from the common connection. In such case the conductive coating 18' on the edge of the support member 11 may be omitted. Leads may be attached to the exposed ledges of coating 18 (FIG. 1) in the same manner as leads 33 and 34 are attached to the input and output terminal areas, to enable convenient attachment to external circuits. A threaded stud may be attached to the bottom of support member 10 for convenient attachment of a heat sink, if desired.

Figure 13:
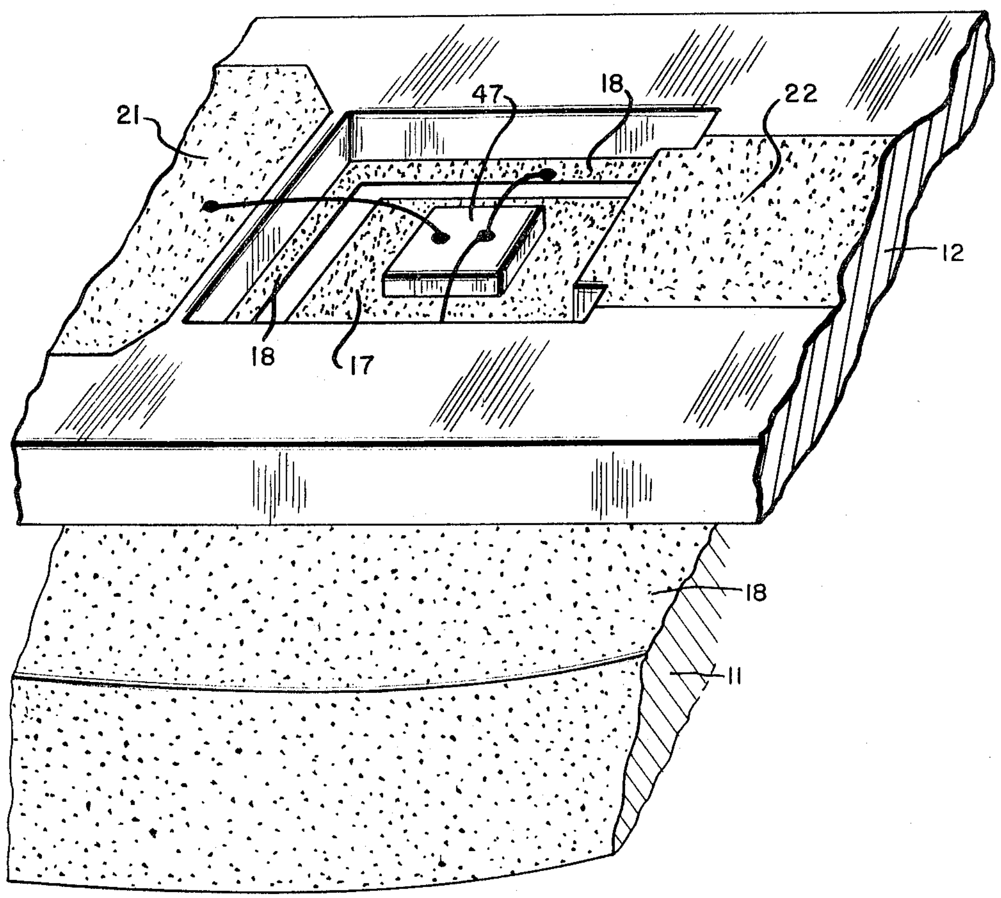
FIG. 13 is a perspective view illustrating modifications of the conductive areas of the microwave package.

Although the shielding provided by the conductive coating 23 on the wall of the aperture 19 is considered highly advantageous, the coating may be modified or eliminated if desired while retaining other features of the invention. Thus, only the portions of coating 23 connecting conductive areas 24, 24' to the common or ground plane area 18 may be employed, or the coating 23 could be completely eliminated and conductive areas 25, 25' on the outer edges relied upon for the common connection, particularly if the cap 15 is metallic and connected to the ground plane as already described. If it is unnecessary to connect the cap to the ground plane, conductive areas 25, 25' could be omitted, thereby leaving areas 24, 24' isolated from the ground plane 18. External connections could then be made to areas 24, 24' outside the sealing ring 13, thereby connecting up with the leads of the microwave device which are connected to areas 24, 24' inside the sealing ring. The ground plane 18 could then be separately connected to the transmission line or other components with which the package is used. Or, areas 24, 24' could also be omitted and the common or ground plane area 18 extended somewhat within the aperture 19 to allow connection of leads thereto. FIG. 13 illustrates certain of these modifications. As compared to FIG. 10, the wall conductive coating 23 and conductive areas 24, 24', 25, 25' have been eliminated, and the intermediate conductive area 18 extended into the aperture so as to allow the common leads of transistor 47 to be connected thereto. In all of these modifications, the connections from the microwave device to the package terminals may be made inside the chamber formed by support member 11, aperture 19 and the cap assembly including sealing ring 13 prior to sealing the cap in place, and an hermetic seal may be obtained when the cap is attached. The input and output sections will still have a strip line configuration. Also, the output terminal area 17 will be on a different plane than the input terminal area 21 and will be encircled by the common or ground plane area 18, thereby retaining some of the isolation advantages of the package illustrated in FIGS. 1–6.

The invention has been described in connection with a specific embodiment thereof, and certain modifications have been mentioned. It will be understood that further modifications may be made within the spirit and scope of the invention, as meets the requirements of the intended application. Also, selected features of the invention may be employed while omitting others.

We claim:

1. A microwave package for holding a microwave device and having an input, output and a common terminal for connection therewith of respective terminals of the microwave device which comprises a. a support member,
b. a spacer member mounted on said support member and having an aperture therein for receiving a said microwave device,
c. spaced conductive areas on the surface of said spacer member opposite said support member forming input and output terminal areas,
d. a shielding conductive area on the wall of said aperture adjacent one of said terminal areas,
e. said shielding conductive area being insulated from said terminal areas,
f. an intermediate conductive area between said support and spacer members extending under said input and output terminal areas and connected to the shielding conductive area on the wall of said aperture,
g. and conductive means connected with said intermediate conductive area for forming said common terminal of the package.

2. A microwave package according to claim 1 in which said intermediate conductive area extends down the edge of said support member for connection with said common terminal of the package.

4. A microwave package for holding a microwave device and having input, an output and a common terminal for connection therewith of respective terminals of the microwave device which comprises a. a support member having on the upper surface thereof an inner conductive area and an outer conductive area insulated therefrom,
b. a spacer member mounted on said upper surface of the support member and having an aperture therein over said inner conductive area for receiving a said microwave device,
c. spaced conductive areas on the upper surface of said spacer member forming input and output terminal areas,
d. conductive means connecting one of said terminal areas with said inner conductive area,
e. a shielding conductive area on the wall of said aperture adjacent the other of said terminal areas,
f. said shielding conductive area being connected with said outer conductive area of the support member and insulated from said terminal areas,
g. and conductive means connected with said outer conductive area for forming said common terminal of the package.

5. A microwave package according to claim 4 in which said shielding conductive area extends down the wall of said aperture and joins with said outer conductive area of the support member.

6. A microwave package according to claim 5 in which said outer conductive area extends down the edge of said support member for connection with said common terminal of the package.

7. A microwave package for holding a microwave device and having an input, output and a common terminal for connection therewith of respective terminals of the microwave device which comprises a. a support member of electrically insulating thermally conductive material having on the upper surface thereof an inner conductive area and an outer conductive area substantially encircling said inner area and insulated therefrom,
b. a spacer member of insulating material hermetically sealed to said upper surface of the support member and having an aperture therethrough over said inner conductive area for receiving a said microwave device,
c. spaced conductive areas on the upper surface of said spacer member forming input and output terminal areas,
d. a connecting conductive area on a portion of the wall of said aperture adjacent one of said terminal areas connecting said one terminal area with said inner conductive area,
e. a shielding conductive area on the wall of said aperture adjacent the other of said terminal areas and extending around a major portion of the wall between said other terminal area and said connecting conductive area,
f. said shielding conductive area extending down to and being connected with said outer conductive area of the support member and insulated from said terminal areas,
g. and conductive means connected with said outer conductive area for forming said common terminal of the package.

12. A microwave package according to claim 7 in which said outer conductive area extends down the edge of said support member at least in edge regions beneath said input and output terminal areas and over the bottom of the support member.

10. Apparatus according to claim 7 including a microwave device mounted in said aperture, and a cap hermetically sealed to said spacer member over said aperture.

11. Apparatus according to claim 10 in which said cap is electrically conductive and insulated from said input and output terminal areas, and including conductive means connecting said cap with said common terminal.

13. A microwave package according to claim 12 including an electrically and thermally conductive mounting header joined with said support member on said bottom thereof.

8. A microwave package according to claim 7 in which said shielding conductive area extends over the edge of said aperture onto the upper surface of said spacer member in a region between said terminal areas and insulated therefrom.

14. A microwave package according to claim 12 in which said terminal areas are on opposite sides of said aperture, and said shielding conductive area extends over the edge of said aperture onto the upper surface of said spacer member in regions on opposite sides of the aperture lying between said terminal areas and insulated therefrom.

15. A microwave package according to claim 14 in which said outer conductive area extends down the edge of said support member around substantially the entire periphery thereof.

16. A microwave package according to claim 15 including an electrically and thermally conductive mounting header joined with said support member on said bottom thereof.

17. Apparatus according to claim 15 including a microwave device mounted in said aperture, and a cap hermetically sealed to said space member over said aperture.

18. Apparatus according to claim 17 in which said cap is electrically conductive and insulated from said input and output terminal areas, and including conductive means connecting said cap with said common terminal.

19. Apparatus according to claim 18 including an electrically and thermally conductive mounting header joined with said support member on said bottom thereof.

3. A microwave package according to claim 1 in which said input and output terminal areas and said intermediate conductive area form respective strip transmission line sections.

9. A microwave package according to claim 7 in which said input and output terminal areas and said outer conductive area form respective strip transmission line sections, the widths of said terminal areas and the dielectric constant and thickness of said spacer member being selected to yield predetermined impedance values for said sections.

20. A microwave package for holding a microwave device and having an input, an output and a common terminal for connection therewith of respective terminals of the microwave device which comprises a. a support member, b. a spacer member mounted on said support member and having an aperture therein for receiving a said microwave device, c. spaced conductive areas extending adjacent respectively spaced edges of said aperture on the surface of said spacer member opposite said support member to form input and output terminal areas, d. an inner conductive area on the upper surface of said support member within said aperture in non-overlapping relationship with one of said input and output terminal areas, e. means for connecting said inner conductive area with the other of said input and output terminal areas, f. an intermediate conductive area between said support and spacer members extending under said input and output terminal areas, g. and conductive means connected with said intermediate conductive area for forming a common terminal of the package, h. said intermediate conductive area being in substantially the same plane as said inner conductive area and the portion thereof under said one of the input and output terminal areas extending at least to approximately the edge of said aperture for a peripheral distance greater than the width of said one area to thereby substantially reduce capacitive coupling between the input and output conductive areas.

21. A microwave package according to claim 20 in which said intermediate conductive area substantially encircles said inner conductive area and extends into said aperture around at least a portion of the periphery thereof.

22. A microwave package according to claim 20 in which said intermediate conductive area extends down the edge of said support member at least in regions beneath said input and output terminal areas and over the bottom of the support member to form at least part of said conductive means.

23. A microwave package according to claim 20 including a. a sealing ring attached to the top of said spacer member and encircling said aperture, b. said input and output terminal areas extending inside said sealing ring, c. and cap means for sealing to said sealing ring after mounting of a microwave device in said package, d. said support member, aperture and cap means forming a sealed chamber for said microwave device, e. said conductive means and intermediate conductive area connected therewith including a conductive area within said chamber.

24. A microwave package according to claim 23 in which said intermediate conductive area extends into said chamber to form the last-mentioned conductive area.

25. A microwave package for holding a microwave device and having an input, and output and a common terminal for connection therewith of respective terminals of the microwave device which comprises a. a support member of electrically insulating thermally conductive material, b. a spacer member of electrically insulating material mounted on said support member and having an aperture therein for receiving a said microwave device, c. spaced conductive areas extending adjacent approximately opposite edges of said aperture on the surface of said spacer member opposite said support member to form input and output terminal areas, d. an inner conductive area on the upper surface of said support member within said aperture in non-overlapping relationship with one of said input and output terminal areas, e. means for connecting said inner conductive area with the other of said input and output terminal areas, f. an intermediate conductive area between said support and spacer members substantially encircling said inner conductive area and insulated therefrom, g. said intermediate conductive area being in substantially the same plane as said inner conductive area and the portion thereof under said one of the input and output terminal areas extending at least to the edge of said aperture for a peripheral distance greater than the width of said one area to thereby substantially reduce capacitive coupling between the input and output conductive areas, h. said intermediate conductive area extending into said aperture around at least a portion of the periphery thereof, i. conductive means connected with said intermediate conductive area for forming a common terminal of the package, j. a cap, k. and means for hermetically sealing said cap over said aperture after mounting of a microwave device therein.

* * * * *

PO-1050
(5/69)

UNITED STATES PATENT OFFICE
CERTIFICATE OF CORRECTION

Patent No. 3,651,434 Dated March 21, 1972

Inventor(s) PATRICK L. McGEOUGH, GEORGE J. GILBERT and DONALD F. HENRIKSON.

It is certified that error appears in the above-identified patent and that said Letters Patent are hereby corrected as shown below:

Col. 5, line 61, for "taken" read -- take -- .

Col. 7, line 26, before "output" insert -- an -- .

Col. 7, line 53, before "input" insert -- an -- .

Col. 8, line 10, before "output" insert -- an -- .

Col. 10, line 19, before "output" change "and" to -- an -- .

Claims 3, 8, 9, 10 and 11 are printed out of order, but are otherwise correct.

Signed and sealed this 21st day of November 1972.

(SEAL)
Attest:

EDWARD M.FLETCHER,JR.
Attesting Officer

ROBERT GOTTSCHALK
Commissioner of Patent